(12) United States Patent
Cho

(10) Patent No.: US 11,700,466 B2
(45) Date of Patent: Jul. 11, 2023

(54) IMAGE SENSING DEVICE

(71) Applicant: SK hynix Inc., Icheon-si (KR)

(72) Inventor: Sung Wook Cho, Icheon-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 17/678,344

(22) Filed: Feb. 23, 2022

(65) Prior Publication Data

US 2023/0016604 A1 Jan. 19, 2023

(30) Foreign Application Priority Data

Jul. 13, 2021 (KR) .................. 10-2021-0091753
Aug. 18, 2021 (KR) .................. 10-2021-0108948

(51) Int. Cl.
*H04N 25/704* (2023.01)
*H01L 27/146* (2006.01)
*H04N 25/11* (2023.01)
*H04N 25/79* (2023.01)

(52) U.S. Cl.
CPC ....... *H04N 25/704* (2023.01); *H01L 27/1463* (2013.01); *H01L 27/14621* (2013.01); *H01L 27/14627* (2013.01); *H01L 27/14645* (2013.01); *H04N 25/11* (2023.01); *H04N 25/79* (2023.01)

(58) Field of Classification Search
CPC ...... H04N 25/704; H04N 25/11; H04N 25/79; H01L 27/14621; H01L 27/14627; H01L 27/1463; H01L 27/14645; H01L 27/14605
See application file for complete search history.

(56) References Cited

U.S. PATENT DOCUMENTS

| | | | |
|---|---|---|---|
| 9,443,899 B1* | 9/2016 | Liu | .................. H01L 27/1464 |
| 2017/0301718 A1 | 10/2017 | Chou et al. | |
| 2018/0301484 A1* | 10/2018 | Vaartstra | .......... H01L 27/14621 |
| 2019/0035838 A1* | 1/2019 | Byun | .................... H01L 23/50 |
| 2019/0035839 A1* | 1/2019 | Byun | ............... H01L 27/14645 |
| 2019/0045111 A1* | 2/2019 | Galor Gluskin | ....... H04N 25/77 |
| 2019/0319060 A1* | 10/2019 | Do | ........................ H04N 25/134 |
| 2020/0396388 A1* | 12/2020 | Kim | ...................... H04N 25/75 |
| 2021/0120198 A1* | 4/2021 | Kim | ................. H01L 27/14641 |

FOREIGN PATENT DOCUMENTS

KR 20180065169 A 6/2018
KR 20200040617 A 4/2020

* cited by examiner

*Primary Examiner* — Lin Ye
*Assistant Examiner* — John H Morehead, III
(74) *Attorney, Agent, or Firm* — Perkins Coie LLP

(57) ABSTRACT

An image sensing device includes a pixel array including image sensing pixels, phase detection pixel pairs disposed between the image sensing pixels, photoelectric conversion regions corresponding to the image sensing pixels and the phase detection pixels, device isolation structures isolating the photoelectric conversion regions, color filters corresponding to the image sensing pixels and the phase detection pixel pairs, a first grid structure disposed between a color filter of a first image sensing pixel and a color filter of an adjacent first phase detection pixel pair and shifted by a first distance from a first device isolation structure disposed between the first image sensing pixel and the first phase detection pixel pair, and a second grid structure disposed in color filters of the first phase detection pixel pair and shifted by a second distance from a second device isolation structure disposed between the first phase detection pixel pairs.

20 Claims, 12 Drawing Sheets

IMAGE SENSING DEVICE

CROSS-REFERENCE TO RELATED APPLICATION

This patent document claims the priority and benefits of Korean patent application No. 10-2021-0091753 filed on Jul. 13, 2021 and Korean patent application No. 10-2021-0108948 filed on Aug. 18, 2021. The entire contents of each application are incorporated by reference in their entirety as part of the disclosure of this patent document.

TECHNICAL FIELD

The technology and implementations disclosed in this patent document generally relate to an image sensing device including phase detection pixels.

BACKGROUND

An image sensing device is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras and robots.

SUMMARY

Various embodiments of the disclosed technology relate to an image sensing device capable of improving phase detection characteristics.

In an embodiment of the disclosed technology, an image sensing device may include a pixel array including a plurality of image sensing pixels and phase detection pixel pairs. The phase detection pixel pairs are disposed between the image sensing pixels and include phase detection pixels. The pixel array may include a plurality of photoelectric conversion regions formed in a substrate to correspond to the image sensing pixels and the phase detection pixels, a plurality of device isolation structures disposed in the substrate to isolate the photoelectric conversion regions from one another, a plurality of color filters disposed over the substrate to correspond to the image sensing pixels and the phase detection pixel pairs, a first grid structure disposed between a color filter of a first image sensing pixel from among the plurality of image sensing pixels and a color filter of a first phase detection pixel pair adjacent to the first image sensing pixel from among the phase detection pixel pairs, and shifted by a first distance from a first device isolation structure disposed between a photoelectric conversion region of the first image sensing pixel and photoelectric conversion regions of the first phase detection pixel pair, and a second grid structure disposed in the color filter of the first phase detection pixel pair, and shifted by a second distance different from the first distance from a second device isolation structure disposed between photoelectric conversion regions of the first phase detection pixel pair.

In another embodiment of the disclosed technology, an image sensing device may include a pixel array including a plurality of image sensing pixels and phase detection pixel pairs. The phase detection pixel pairs are disposed between the image sensing pixels and include a plurality of phase detection pixels. The pixel array may include a plurality of first grid structures disposed between the image sensing pixels, and disposed between the image sensing pixels and the phase detection pixel pairs, and a plurality of second grid structures disposed between the plurality of phase detection pixels. The second grid structures may have a different width from the first grid structure.

In another embodiment of the disclosed technology, an image sensing device may include an image sensing device may include a pixel array in which a plurality of image sensing pixels and phase detection pixel pairs are arranged such that the phase detection pixel pairs in which a plurality of phase detection pixels is arranged adjacent to each other are disposed between the image sensing pixels. The pixel array may include a plurality of photoelectric conversion regions formed in a substrate to correspond to the image sensing pixels and the phase detection pixels, a plurality of device isolation structures disposed between the photoelectric conversion regions adjacent to each other in the substrate, a plurality of color filters disposed over the substrate to correspond to the image sensing pixels and the phase detection pixel pairs, a first grid structure disposed between a color filter of a first image sensing pixel and color filters of first phase detection pixel pairs adjacent to the first image sensing pixel from among the image sensing pixels and the phase detection pixel pairs, and shifted by a first distance from a device isolation structure disposed between a photoelectric conversion region of the first image sensing pixel and photoelectric conversion regions of the first phase detection pixel pairs, and a second grid structure disposed in color filters of the first phase detection pixel pairs, and shifted by a second distance different from the first distance from a device isolation structure disposed between photoelectric conversion regions of the first phase detection pixel pairs.

In another embodiment of the disclosed technology, an image sensing device may include a pixel array in which a plurality of image sensing pixels and phase detection pixel pairs are arranged such that the phase detection pixel pairs in which a plurality of phase detection pixels is arranged adjacent to each other are disposed between the image sensing pixels. The pixel array may include a first grid structure disposed between the image sensing pixels, and disposed between each of the image sensing pixels and the phase detection pixel pairs, and a second grid structure disposed between the plurality of phase detection pixels. The second grid structure may be formed to have a different width from the first grid structure.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device including phase detection pixels, and the disclosed features may be implemented to achieve one or more advantages in more applications. Some implementations of the disclosed technology suggest designs of an image sensing device which can improve phase detection characteristics. The disclosed technology provides various implementations of an image sensing device which can improve a grid structure of phase detection pixels, resulting in improvement in phase detection characteristics.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
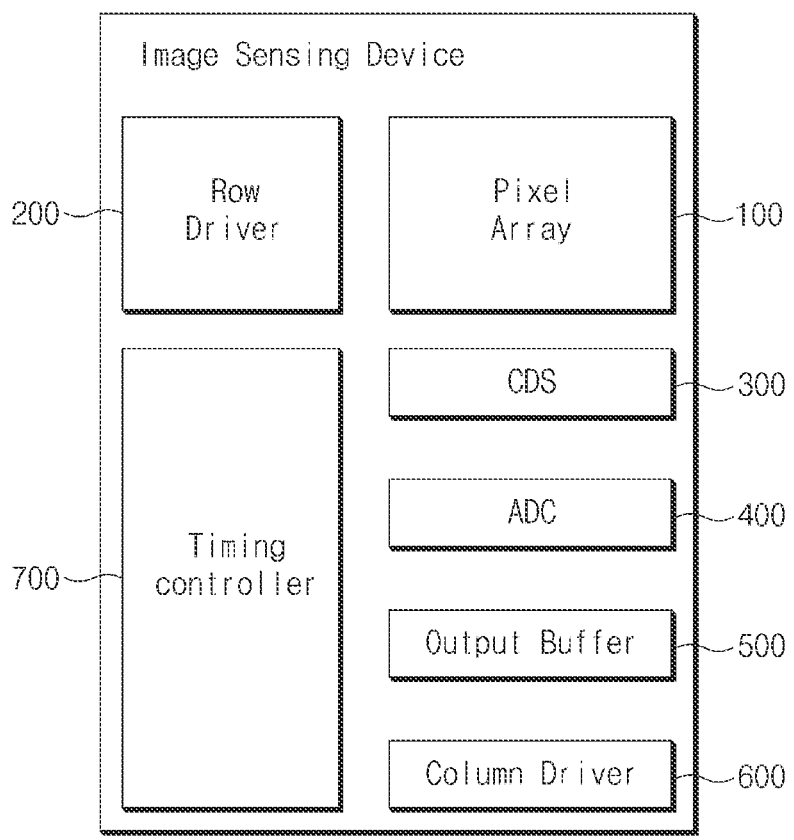
FIG. 1 is a block diagram illustrating an example of an image sensing device based on some implementations of the disclosed technology.

FIG. 1 is a block diagram illustrating an image sensing device based on some implementations of the disclosed technology.

Referring to FIG. 1, the image sensing device may include a pixel array 100, a row driver 200, a correlated double sampler (CDS) 300, an analog-digital converter (ADC) 400, an output buffer 500, a column driver 600 and a timing controller 700. The components of the image sensing device illustrated in FIG. 1 are discussed by way of example only, and this patent document encompasses numerous other changes, substitutions, variations, alterations, and modifications.

The pixel array 100 may include a plurality of unit pixels arranged in rows and columns. In one example, the plurality of unit pixels can be arranged in a two dimensional (2D) pixel array including rows and columns. In another example, the plurality of unit pixels can be arranged in a three dimensional (3D) pixel array. The plurality of unit pixels may convert an optical signal into an electrical signal on a unit pixel basis or a pixel group basis, where unit pixels in a pixel group share at least certain internal circuitry. The plurality of unit pixels may include a plurality of image sensing pixels and a plurality of phase detection pixels. Each of the image sensing pixels may generate an image signal acting as an electrical signal corresponding to a target object to be captured. Each of the phase detection pixels may generate a phase signal acting as an electrical signal that is used to calculate a phase difference between images captured by the image sensing pixels.

The pixel array 100 may receive driving signals (for example, a row selection signal, a reset signal, a transmission (or transfer) signal, etc.) from the row driver 200. Upon receiving the driving signal, the unit pixels may be activated to perform the operations corresponding to the row selection signal, the reset signal, and the transfer signal.

The row driver 200 may activate the pixel array 100 to perform certain operations on the unit pixels in the corresponding row based on control signals provided by controller circuitry such as the timing controller 700. In some implementations, the row driver 200 may select one or more pixel groups arranged in one or more rows of the pixel array 100. The row driver 200 may generate a row selection signal to select one or more rows from among the plurality of rows. The row driver 200 may sequentially enable the reset signal and the transfer signal for the unit pixels arranged in the selected row. The pixel signals generated by the unit pixels arranged in the selected row may be output to the correlated double sampler (CDS) 300.

The correlated double sampler (CDS) 300 may remove undesired offset values of the unit pixels using correlated double sampling. In one example, the correlated double sampler (CDS) 300 may remove the undesired offset values of the unit pixels by comparing output voltages of pixel signals (of the unit pixels) obtained before and after photocharges generated by incident light are accumulated in the sensing node (i.e., a floating diffusion (FD) node). As a result, the CDS 300 may obtain a pixel signal generated only by the incident light without causing noise. In some implementations, upon receiving a clock signal from the timing controller 700, the CDS 300 may sequentially sample and hold voltage levels of the reference signal and the pixel signal, which are provided to each of a plurality of column lines from the pixel array 100. That is, the CDS 300 may sample and hold the voltage levels of the reference signal and the pixel signal which correspond to each of the columns of the pixel array 100. In some implementations, the CDS 300 may transfer the reference signal and the pixel signal of each of the columns as a correlate double sampling (CDS) signal to the ADC 400 based on control signals from the timing controller 700.

The ADC 400 is used to convert analog CDS signals received from the CDS 300 into digital signals. In some implementations, the ADC 400 may be implemented as a ramp-compare type ADC. The analog-to-digital converter (ADC) 400 may compare a ramp signal received from the timing controller 700 with the CDS signal received from the CDS 300, and may thus output a comparison signal indicating the result of comparison between the ramp signal and the CDS signal. The analog-to-digital converter (ADC) 400 may count a level transition time of the comparison signal in response to the ramp signal received from the timing controller 700, and may output a count value indicating the counted level transition time to the output buffer 500.

The output buffer 500 may temporarily store column-based image data provided from the ADC 400 based on control signals of the timing controller 170. The image data received from the ADC 400 may be temporarily stored in the output buffer 500 based on control signals of the timing controller 700. The output buffer 500 may provide an interface to compensate for data rate differences or transmission rate differences between the image sensing device and other devices.

The column driver 600 may select a column of the output buffer 500 upon receiving a control signal from the timing controller 700, and sequentially output the image data, which are temporarily stored in the selected column of the output buffer 500. In some implementations, upon receiving an address signal from the timing controller 700, the column driver 600 may generate a column selection signal based on the address signal, may select a column of the output buffer 500 using the column selection signal, and may control the image data received from the selected column of the output buffer 500 to be output as an output signal.

The timing controller 700 may generate signals for controlling operations of the row driver 200, the ADC 400, the output buffer 500 and the column driver 600. The timing controller 700 may provide the row driver 200, the column driver 600, the ADC 400, and the output buffer 500 with a clock signal required for the operations of the respective components of the image sensing device, a control signal for timing control, and address signals for selecting a row or column. In some implementations, the timing controller 700 may include a logic control circuit, a phase lock loop (PLL) circuit, a timing control circuit, a communication interface circuit and others.

Figure 2:
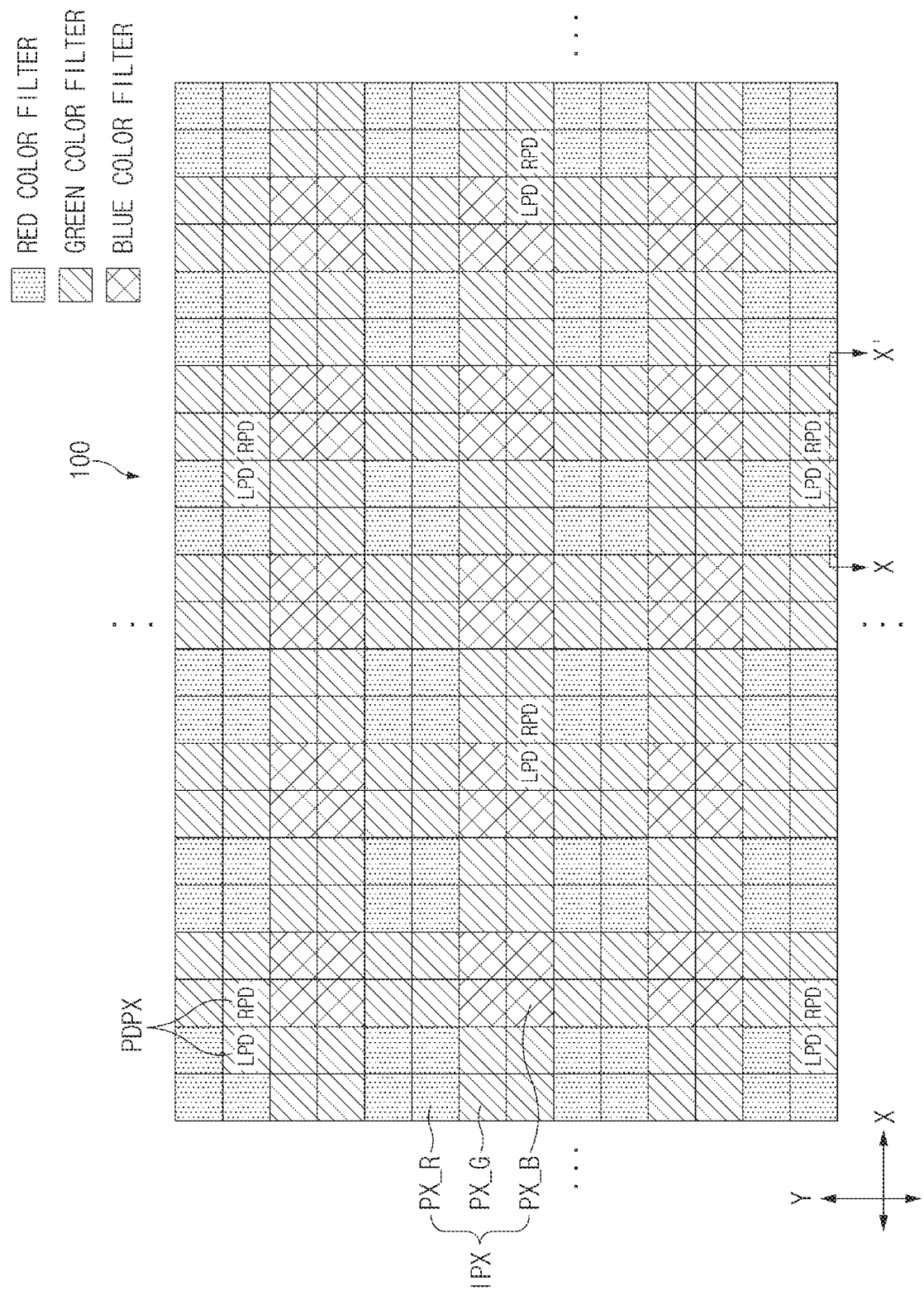
FIG. 2 is a plan view illustrating an example of a pixel array shown in FIG. 1 based on an embodiment of the disclosed technology.

FIG. 2 is a plan view illustrating an example of the pixel array 100 shown in FIG. 1 based on an embodiment of the disclosed technology.

Referring to FIG. 2, the pixel array 100 may include a plurality of unit pixels consecutively arranged in row and column directions. The plurality of unit pixels may include a plurality of image sensing pixels (IPX), and a plurality of phase detection pixel pairs (PDPX).

The plurality of image sensing pixels (IPX) may detect incident light to generate image signals corresponding to an image of a target object in the incident light. The plurality of image sensing pixels (IPX) may include a red pixel (PX_R) for generating an image signal corresponding to red light, a green pixel (PX_G) for generating an image signal corresponding to green light, and a blue pixel (PX_B) for generating an image signal corresponding to blue light.

Each of the image sensing pixels (IPX) may include the unit pixels arranged in an (N×N) array and including color filters of the same color (where, 'N' is a natural number of 2 or greater). In some implementations, the red pixel (PX_R) includes a photoelectric conversion element covered by a red color filter, the green pixel (PX_G) includes a photoelectric conversion element covered by a green color filter, and the blue pixel (PX_B) includes a photoelectric conversion element covered by a blue color filter. In some implementations, the image sensing pixels (IPX) may include red sub-pixel blocks, each of which has a structure in which four red pixels (PX_R) are arranged in a (2×2) array, green sub-pixel blocks, each of which has a structure in which four green pixels (PX_G) are arranged in a (2×2) array, and blue sub-pixel blocks, each of which has a structure in which four blue color pixels (PX_B) are arranged in a (2×2) array. The pixel array 100 may include a quad structure in which the red sub-pixel blocks, the green sub-pixel blocks, and the blue sub-pixel blocks are arranged in a Bayer pattern.

The phase detection pixel pairs (PDPX) may be disposed between the image sensing pixels (IPX) to generate phase signals for calculating a phase difference between images formed by capturing an image of a target object. The plurality of phase detection pixel pairs (PDPX) may include two phase detection pixels adjacent to each other in a first direction (X-axis direction) or in a second direction (Y-axis direction). For example, each of the phase detection pixel pairs (PDPX) may include a first phase detection pixel (LPD) and a second phase detection pixel (RPD) that are disposed adjacent to each other in the first direction, as shown in FIG. 2.

Although the first and second phase detection pixels LPD and RPD shown in FIG. 2 are disposed adjacent to each other in a first direction (X direction), the first and second phase detection pixels LPD and RPD can also be disposed adjacent to each other in a second direction (Y direction). In other implementations, each of the phase detection pixel pairs (PDPX) may include four phase detection pixels adjacent to each other in first and second directions to detect phase differences in both the first and second directions.

The first and second phase detection pixels LPD and RPD included in each of the phase detection pixel pairs (PDPX) may include color filters of the same color. For example, as shown in FIG. 2, the first and second phase detection pixels LPD and RPD may include green color filters. Although FIG. 2 illustrates one color filter formed for each unit pixel (for each image sensing pixel, or for each phase detection pixel), it should be noted that, when the unit pixels of the same color are disposed adjacent to each other, only one color filter is formed across the corresponding unit pixels.

The first and second phase detection pixels LPD and RPD formed in an array may be consecutively formed at regular intervals in the first and second directions.

In the pixel array 100, a grid structure for preventing crosstalk between adjacent color filters may be formed between color filters of the unit pixels. In this case, the grid structure disposed between the first phase detection pixel LPD and the second phase detection pixel RPD may be different in structure from a grid structure disposed between the image sensing pixels (IPX), and may also be different in structure from a grid structure disposed between the image sensing pixel (IPX) and the phase detection pixel LPD or RPD. In addition, the position and width of the grid structure disposed between the first phase detection pixel LPD and the second phase detection pixel RPD may be determined based on sensitivities of other phase detection pixels located around the corresponding phase detection pixels and image sensing pixels located around the corresponding phase detection pixels and having the same color filters as those of the corresponding phase detection pixels. The position and width of the grid structure disposed between the first phase detection pixel LPD and the second phase detection pixel RPD can be determined as will be described below.

Figure 3:
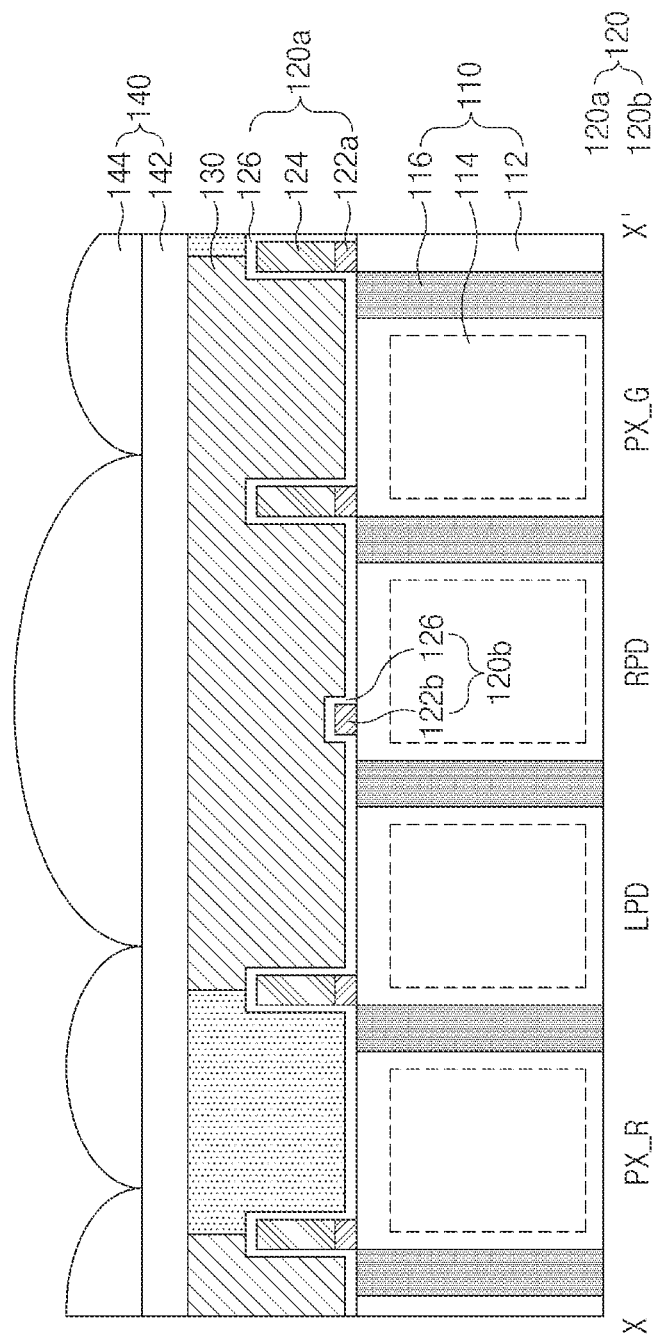
FIG. 3 is a cross-sectional view illustrating an example of the pixel array taken along the line X-X' shown in FIG. 2 based on some implementations of the disclosed technology.

FIG. 3 is a cross-sectional view illustrating an example of the pixel array 100 taken along the line X-X' shown in FIG. 2 based on some implementations of the disclosed technology.

Referring to FIG. 3, the pixel array 100 may include a substrate layer 110, a grid structure 120, a color filter layer 130, and a lens layer 140.

The substrate layer 110 may include a substrate 112, a plurality of photoelectric conversion regions 114, and a plurality of device isolation structures 116. The substrate layer 110 may include a first surface and a second surface facing away from or opposite to the first surface. In this case, the first surface may refer to a light receiving surface upon which light is incident.

The substrate 112 may include a semiconductor substrate including a monocrystalline silicon material. The substrate 112 may include P-type impurities.

The photoelectric conversion regions 114 may be formed in the semiconductor substrate 112 and each photoelectric conversion region 114 can correspond to a unit pixel. The photoelectric conversion regions 114 may perform photoelectric conversion of incident light (e.g., visible light) filtered by the color filter layer 130 to generate photocharges that carry images in the incident light. Each of the photoelectric conversion regions 114 may include N-type impurities.

Each of the device isolation structures 116 may be formed between photoelectric conversion regions 114 of the adjacent unit pixels within the substrate 112 to isolate the photoelectric conversion regions 114 from each other. The device isolation structure 116 may include a trench structure such as a Back Deep Trench Isolation (BDTI) structure or a Front Deep Trench Isolation (FDTI) structure. Alternatively, the device isolation structure 116 may include a junction isolation structure formed by implanting high-density impurities (e.g., P-type impurities) into the substrate 112.

The grid structure 120 may be disposed between the color filters of the adjacent unit pixels to prevent crosstalk between the adjacent color filters. The grid structure 120 may be formed over the first surface of the substrate layer 110. The grid structure 120 may include the first grid structure 120a and the second grid structure 120b.

The first grid structure 120a may be disposed between the color filters of the image sensing pixels PX_R, PX_G, and PX_B, and may also be disposed between the color filters of the image sensing pixels PX_R, PX_G, and PX_B and the color filters of the phase detection pixels LPD and RPD. The first grid structure 120a may include a barrier metal layer 122a, a metal layer 124 disposed over the barrier metal layer 122a, and a capping layer 126 covering the metal layer 124 and the barrier metal layer 122a. The barrier metal layer 122a may include titanium (Ti) or titanium nitride (TiN) or a combination of titanium (Ti) and titanium nitride (TiN) such as a stacked structure thereof. The metal layer 124 may include tungsten (W). The capping layer 126 may include a nitride layer, and may be formed to extend below the color filter layer 130 while covering the barrier metal layer 122a and the metal layer 124. The capping layer 126 may prevent expansion of the metal layer 124 in a thermal annealing process. In the capping layer 126, a region formed below the color filter layer 130 may be used as a portion of an anti-reflection layer.

The second grid structure 120b may be disposed between the color filter of the first phase detection pixel LPD and the color filter of the second phase detection pixel RPD. The second grid structure 120b may include the barrier metal layer 122b, and the capping layer 126 covering the barrier metal layer 122b. Unlike the first grid structure 120a, the metal layer may not be formed over the barrier metal layer 122b in the second grid structure 120b. The barrier metal layer 122b may include the same materials as the barrier metal layer 122a.

Although FIG. 3 illustrates the metal layer 124 as being disposed over the barrier metal layer 122a in the first grid structure 120a by way of example, it should be noted that a different material layer such as an air layer, a low-refractivity material layer, or an oxide layer can be formed in addition to or instead of the metal layer 124.

The color filter layer 130 may include color filters that filter visible light at a certain wavelength range from incident light received through the lens layer 140 and transmit the filtered light to the corresponding photoelectric conversion regions 114. The color filter layer 130 may include a plurality of red color filters, a plurality of green color filters, and a plurality of blue color filters. Each red color filter may transmit visible light at a first wavelength band corresponding to the red color. Each green color filter may transmit visible light at a second wavelength band corresponding to the green color that is shorter than the first wavelength band. Each blue color filter may transmit visible light at a third wavelength band corresponding to the blue color that is shorter than the second wavelength band. In the same-color unit pixels adjacent to each other, one color filter can cover two or more unit pixels. For example, one color filter may be formed across the corresponding unit pixels.

The lens layer 140 may include an over-coating layer 142 and a plurality of microlenses 144. The over-coating layer 142 may be formed over the color filter layer 130. The over-coating layer 142 may operate as a planarization layer that can planarize an uneven surface caused by the color filter layer 130. The microlenses 144 may be formed over the over-coating layer 142. Each of the microlenses 144 may be formed in a hemispherical shape, and may be formed per unit pixel (PX). The microlenses 144 may converge incident light, and may transmit the converged light to the corresponding color filters. One microlens may be formed over each of the image sensing pixels PX_R, PX_G, and PX_B. One microlens may be formed to cover all of the color filters of the two phase detection pixels LPD and RPD. The over-coating layer 142 and the microlenses 144 may be formed of the same materials.

In order to improve shading variations, the microlenses 144, the color filters 130, and the grid structures 120 may be shifted by a predetermined distance corresponding to a chief ray angle (CRA) according to where the image sensing pixels (PX_R, PX_G, PX_B) or the phase detection pixels (LPD, RPD) are placed in the pixel array 100. For example, the microlenses 144 and the color filters 130 may be shifted outward by a predetermined distance corresponding to a CRA of the corresponding unit pixel, and the grid structures 120 may be shifted by a shifted distance corresponding to a CRA of the corresponding unit pixels without being aligned with a device isolation structure 116.

In some implementations, the second grid structure 120b disposed between the phase detection pixels LPD and RPD may not be shifted to correspond to a CRA of the corresponding phase detection pixels LPD and RPD, and may be shifted based on optical characteristics (e.g., light sensitivity) of other phase detection pixels LPD and RPD located around the second grid structure 120b and optical characteristics (e.g., light sensitivity) of the image sensing pixels (PX_G) having the same color filters as the phase detection pixels LPD and RPD. That is, the second grid structure 120b may be shifted by a different distance from the first grid structure 120a.

In some implementations, one pair of phase detection pixels LPD and RPD adjacent to each other may be formed to have the same light sensitivity. In some implementations, light sensitivity of the phase detection pixels LPD and RPD is identical to light sensitivity of peripheral image sensing pixels having the same color filters as the phase detection pixels LPD and RPD. To this end, the pixel array 100 may be divided into a plurality of sub-pixel regions according to a layout structure of the phase detection pixels LPD and RPD. Based on light sensitivity (signal values) of the phase detection pixels (LPD, RPD) and the image sensing pixels PX_G included in each sub-pixel region, the degree of shifting in the second grid structures 120b placed in the corresponding region may be determined.

Figure 4:
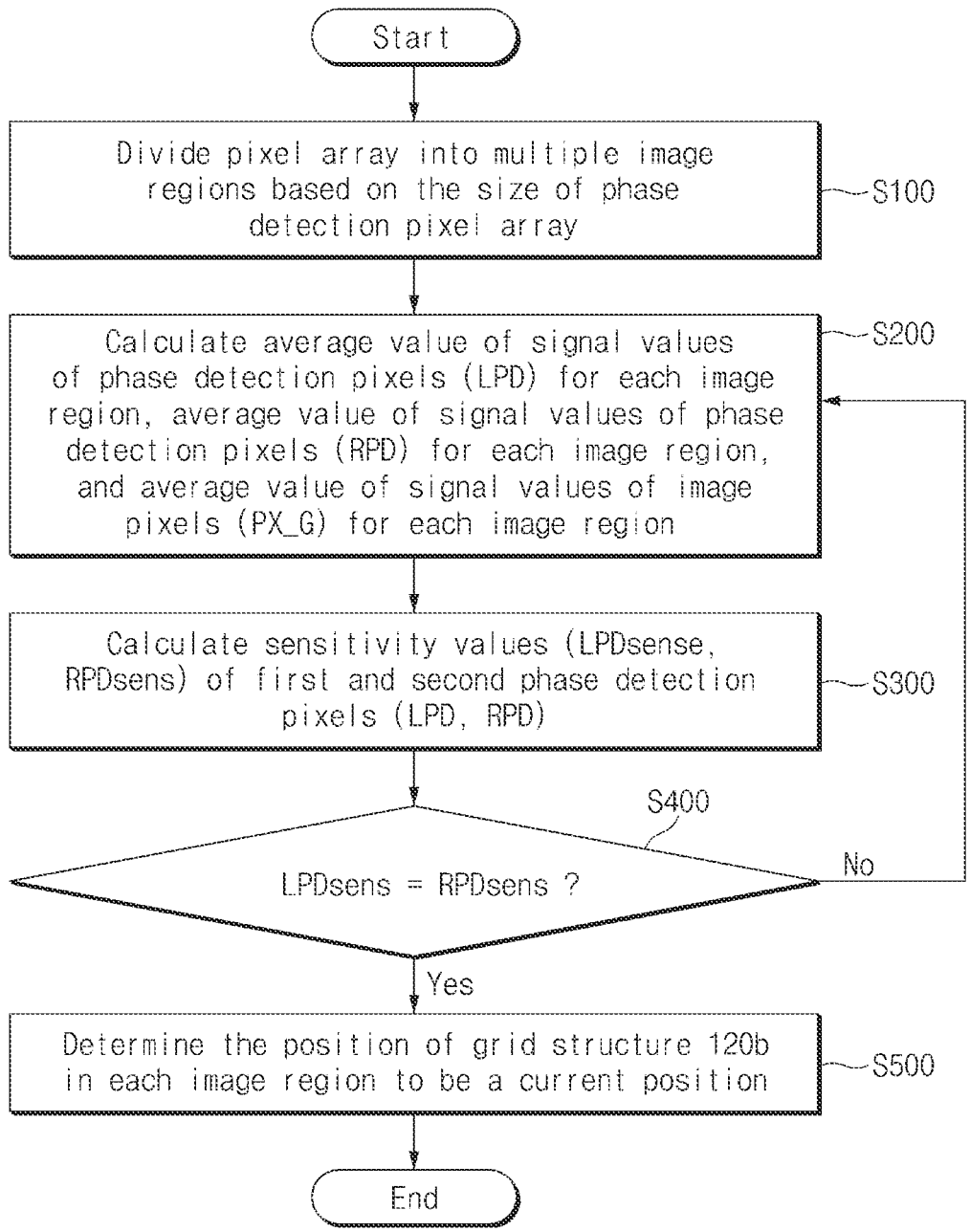
FIG. 4 is a flowchart illustrating an example of a method for determining the position of a second grid structure disposed between phase detection pixels based on some implementations of the disclosed technology.
Figure 5:
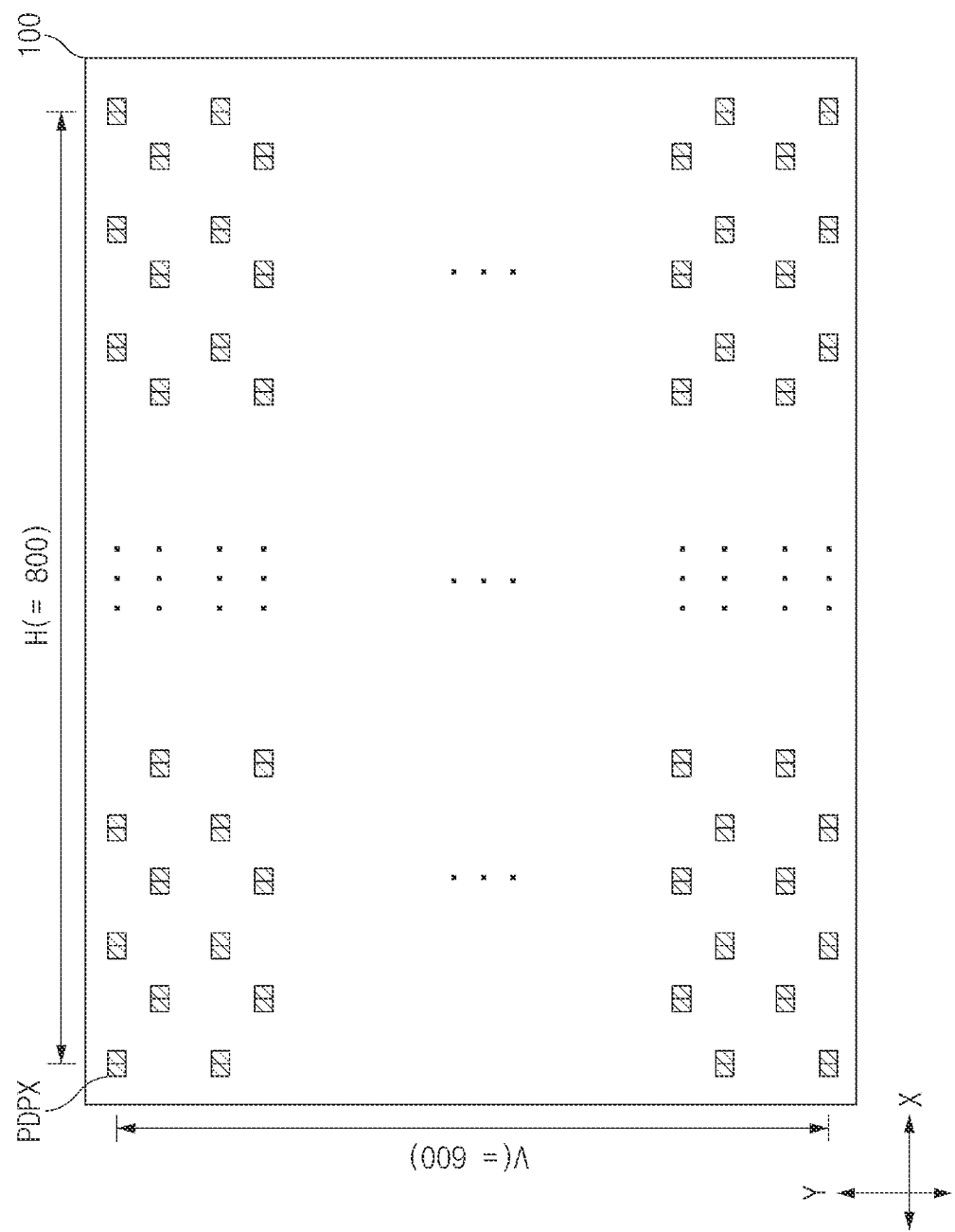
FIG. 5 is a schematic diagram illustrating an example of a phase detection pixel array to be formed in the pixel array shown in FIG. 1 based on some implementations of the disclosed technology.
Figure 6:
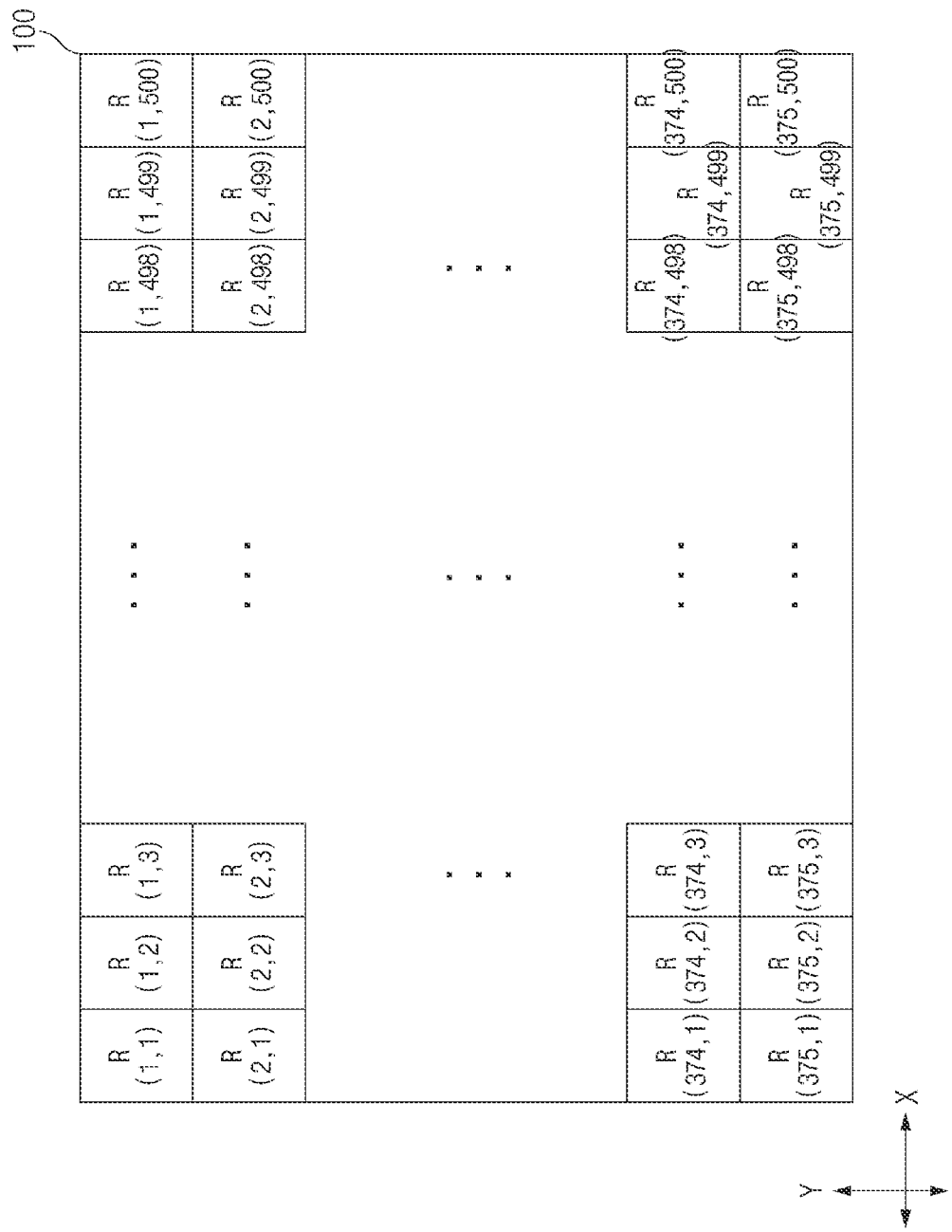
FIG. 6 is a schematic diagram illustrating an example structure in which the pixel array shown in FIG. 5 is divided into a plurality of sub-pixel regions based on some implementations of the disclosed technology.
Figure 7:
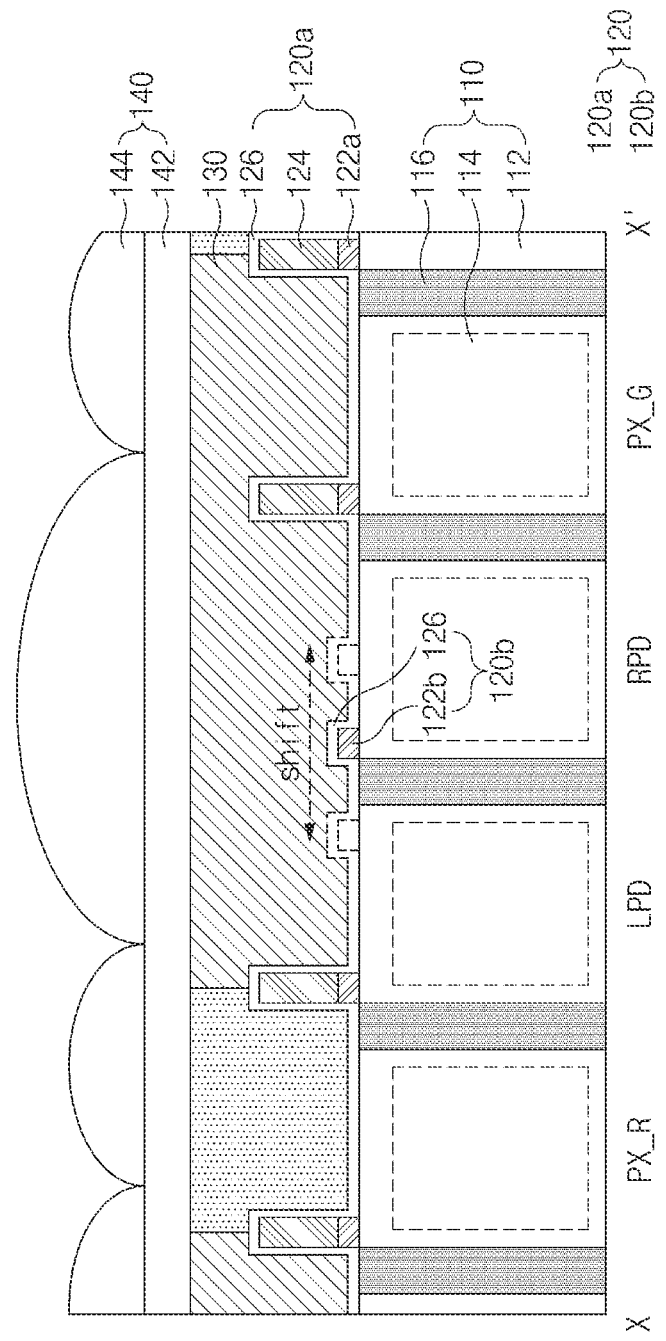
FIG. 7 is a cross-sectional view illustrating an example structure in which the position of a grid structure disposed between the phase detection pixels is shifted based on some implementations of the disclosed technology.
Figure 8:
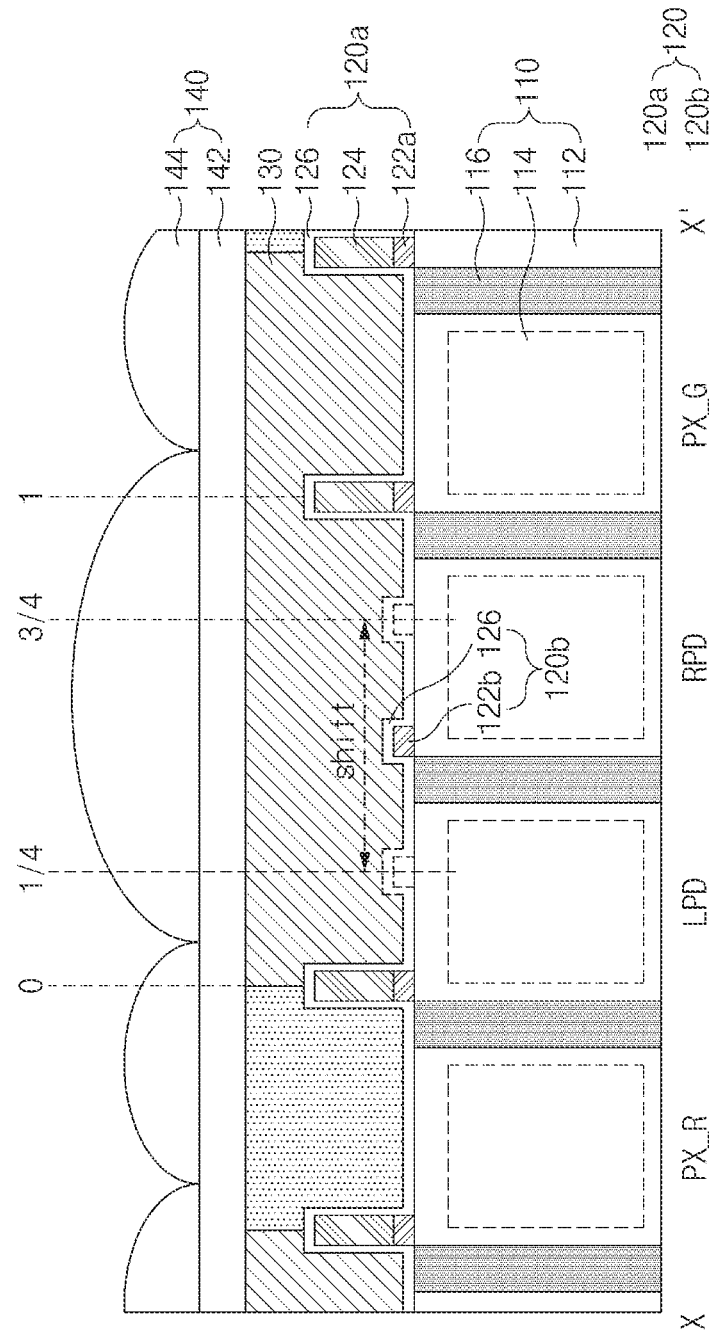
FIG. 8 is a cross-sectional view illustrating an example structure in which the position of the grid structure is shifted based on some implementations of the disclosed technology.

FIG. 4 is a flowchart illustrating an example of a method for determining the position of the second grid structure disposed between phase detection pixels based on some implementations of the disclosed technology. FIG. 5 is a schematic diagram illustrating an example of a phase detection pixel array to be formed in the pixel array shown in FIG. 1 based on some implementations of the disclosed technology. FIG. 6 is a schematic diagram illustrating an example structure in which the pixel array shown in FIG. 5 is divided into a plurality of sub-pixel regions based on some implementations of the disclosed technology. FIG. 7 is a cross-sectional view illustrating an example structure in which the position of a grid structure disposed between the phase detection pixels is shifted based on some implementations of the disclosed technology. FIG. 8 is a cross-sectional view illustrating an example structure in which the position of the grid structure is shifted based on some implementations of the disclosed technology.

The phase detection pixels LPD and RPD may be consecutively arranged in the pixel array 100 at regular intervals in the X-axis and Y-axis directions. For example, as shown in FIG. 5, the pixel array 100 may include a phase detection pixel array in which phase detection pixel pairs PDPX including the adjacent phase detection pixels LPD and RPD are consecutively arranged with the size of H(=800)×V (=600) (where H is a size in the first direction and V is a size in the second direction). The size of such phase detection pixel array may vary depending on a predetermined size (e.g., the number of pixels) of the pixel array 100, and may be determined in advance.

At S100, a design system (not shown) may divide the pixel array 100 into a plurality of sub-pixel regions based on the predetermined size of the phase detection pixel array.

To this end, the design system (not shown) may divide the pixel array 100 into a plurality of sub-pixel regions based on a first value obtained when the number (800) of phase detection pixel pairs PDPX arranged in the first direction of the phase detection pixel array is divided by a predetermined number, and based on a second value obtained when the number (600) of phase detection pixel pairs PDPX arranged in the second direction of the phase detection pixel array is divided by a predetermined number. For example, the design system (not shown) may divide each of the number (800) of first phase detection pixel pairs and the number (600) of second phase detection pixel pairs by 16, so that the pixel array 100 can be divided into '500(=800/16)×375(=600/16)' sub-pixel regions R(1,1) to R(375,500), as illustrated in FIG. 6.

Each of the divided sub-pixel regions R(1,1) to R(375, 500) may include a plurality of phase detection pixel pairs PDPX and a plurality of image sensing pixels (PX_G).

Subsequently, at S200, the design system (not shown) may calculate an average value of signal values of the first phase detection pixels (LPD) for each sub-pixel region, may calculate an average value of signal values of the second phase detection pixels (RPD) for each sub-pixel region, and may calculate an average value of signal values of the image sensing pixels (PX_G) for each sub-pixel region.

For example, the design system (not shown) may calculate an average value (LPDaver) of signal values of the first phase detection pixels (LPD), an average value (RPDaver) of signal values of the second phase detection pixels (RPD), and an average value (PX_Gaver) of signal values of the image sensing pixels (PX_G) captured in a situation where the second grid structure 120b disposed between the phase detection pixels LPD and RPD is also formed to correspond to a chief ray angle (CRA) in the same manner as in the grid structure 120a disposed between the image sensing pixels PX_R, PX_G, and PX_B.

Subsequently, at S300, the design system (not shown) may calculate a sensitivity value (LPDsens) of the first phase detection pixels (LPD) for each sub-pixel region using the average values LPDaver, RPDaver, and PX_Gaver for corresponding sub-pixel region, and may calculate a sensitivity value (RPDsens) of the second phase detection pixels (RPD) for each sub-pixel region using the average values LPDaver, RPDaver, and PX_Gaver for corresponding sub-pixel region.

For example, the design system (not shown) may calculate the sensitivity value (LPDsens) of the first phase detection pixels (LPD) by dividing the average value (LPDaver) of signals of the first phase detection pixels (LPD) by the average value (PX_Gaver) of signals of the image sensing pixels (PX_G), and may calculate the sensitivity value (RPDsens) of the second phase detection pixels (RPD) by dividing the average value (RPDaver) of signals of the second phase detection pixels (RPD) by the average value (PX_Gaver) of signals of the image sensing pixels (PX_G).

Subsequently, at S400, the design system (not shown) may compare the sensitivity value (LPDsens) of the first phase detection pixels (LPD) with the sensitivity value (RPDsens) of the second phase detection pixels (RPD) for each sub-pixel region, and may determine whether two values LPDsens and RPDsens are identical to each other (or may determine whether a difference in the two values LPDsens and RPDsens is within a predetermined range).

When the two values LPDsens and RPDsens are identical to each other (or when a difference in two values is in the predetermined range) at S400, the design system (not shown) may determine that the position of the second grid structure 120b of the corresponding sub-pixel region is the current position at S500.

In contrast, when two values LPDsens and RPDsens are different from each other (or when the difference between the two values LPDsens and RPDsens is not within the predetermined range), the design system (not shown) may again perform the above-mentioned operations S200 to S400 while changing the positions of the second grid structures 120b of the corresponding sub-pixel region, as illustrated in FIG. 7.

In the process of changing the position of the second grid structures 120b, the design system (not shown) may perform positioning of the second grid structures 120b in so far as each of the second grid structures 120b does not pass a centerline of the phase detection pixels LPD and RPD. For example, the design system (not shown) may change the position of the second grid structures 120b only within a region disposed between a first line denoted by '¼' and a second line denoted by '¾' shown in FIG. 8.

In the above-mentioned embodiment, '16' is used as a denominator value by which the pixel array 100 is divided into the plurality of sub-pixel regions R(1,1) to R(375,500), and other implementations are also possible. For example, when the denominator value is too small, the number of pixels included in each sub-pixel region increases, and the number of calculation times at S200 may excessively increase, so that the denominator value may be set to any one of values 16-32 according to the size of the pixel array 100.

The above-mentioned operations shown in FIG. 4 may be performed for each sub-pixel region in all the sub-pixel regions R(1,1) to R(375,500) included in the pixel array 100. Accordingly, the second grid structures 120b may be shifted differently in units of sub-pixel regions, and may be shifted by the same distance within the same sub-pixel region.

Figure 9:
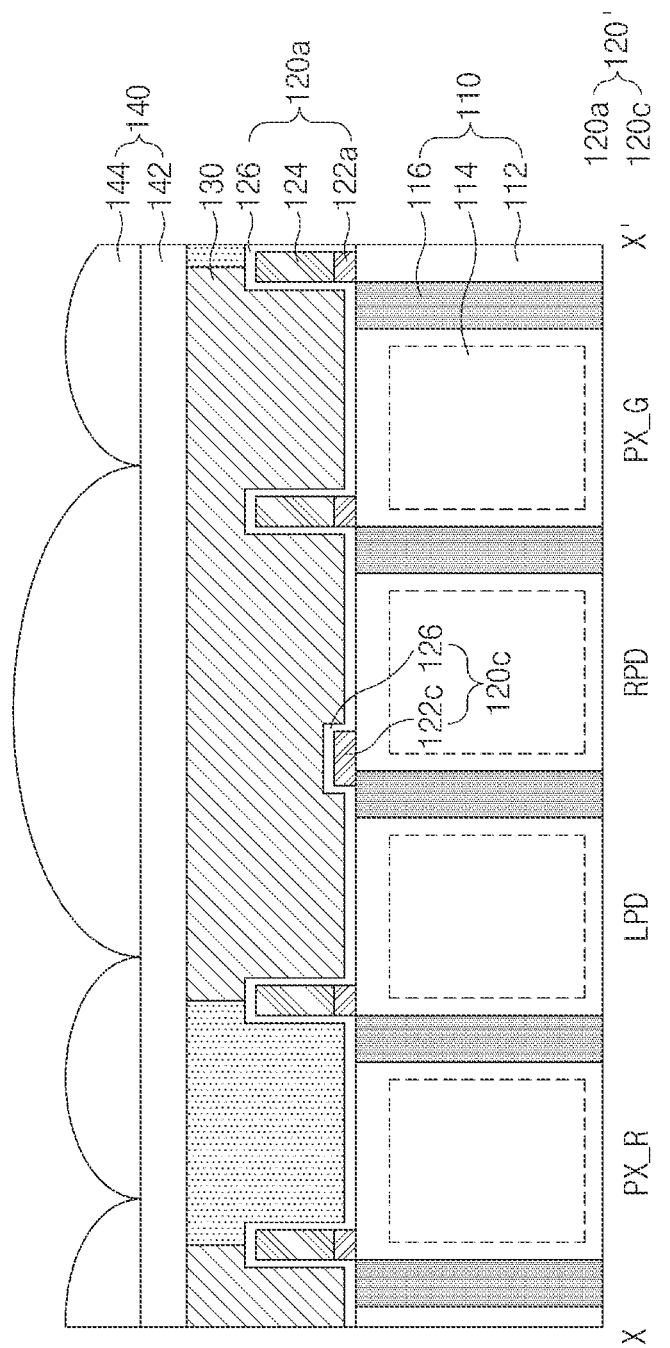
FIG. 9 is a cross-sectional view illustrating another example of the pixel array taken along the line X-X' shown in FIG. 2 based on some implementations of the disclosed technology.
Figure 10:
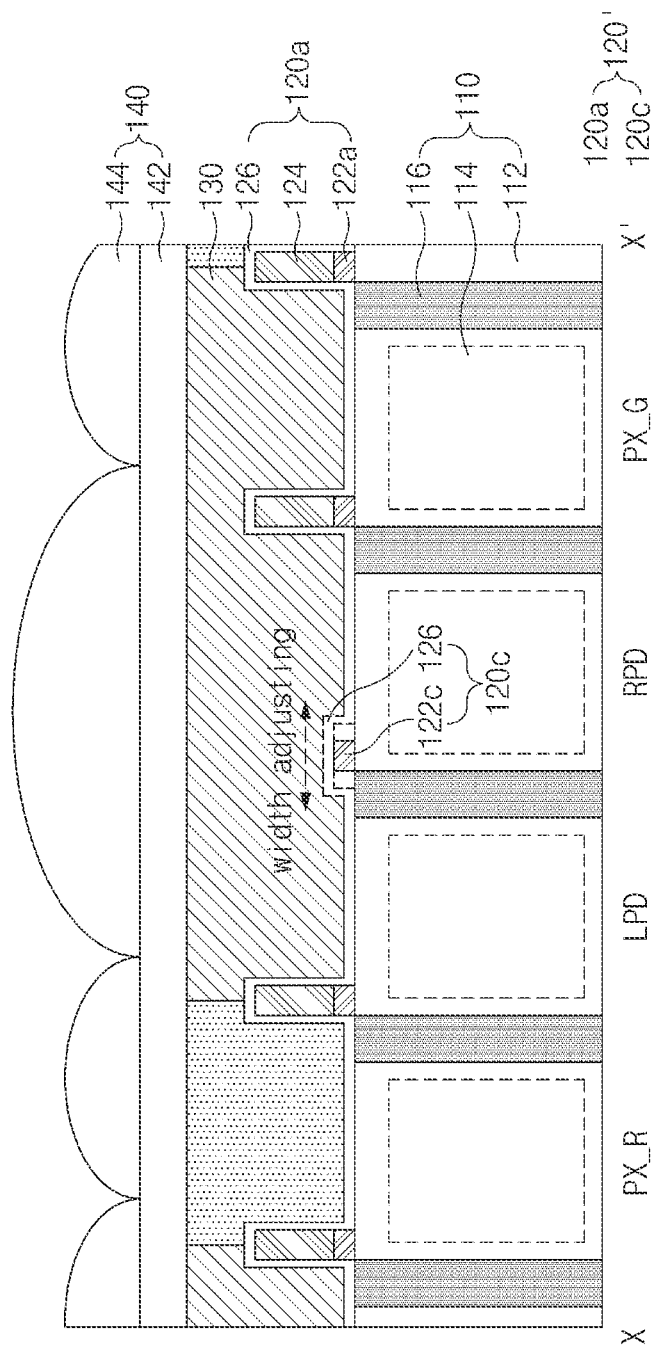
FIG. 10 is a cross-sectional view illustrating an example structure in which the width of a grid structure disposed between phase detection pixels is adjusted based on some implementations of the disclosed technology.

FIG. 9 is a cross-sectional view illustrating another example of the pixel array taken along the line X-X' shown in FIG. 2 based on some implementations of the disclosed technology. FIG. 10 is a cross-sectional view illustrating an example structure in which the width of a grid structure disposed between phase detection pixels is adjusted based on some implementations of the disclosed technology.

In some implementations, the material layers and structures illustrated in FIG. 9 can be similar or identical to the material layers and structures illustrated in FIG. 3. Some of the material layers and structures illustrated in FIG. 9 can be different from what is illustrated in FIG. 3, as will be discussed below.

Referring to FIG. 9, a grid structure 120' may include a first grid structure 120a and a second grid structure 120c.

The first grid structure 120a may be disposed between the color filters of the image sensing pixels PX_R, PX_G, and PX_B, and may also be disposed between the color filters of the image sensing pixels PX_R, PX_G, and PX_B and the color filters of the phase detection pixels LPD and RPD. The first grid structure 120a shown in FIG. 9 may be identical in structure to the grid structure 120a shown in FIG. 3.

The second grid structure 120c may be disposed between the color filters of the phase detection pixels LPD and RPD. The second grid structure 120c may include a barrier metal layer 122c and a capping layer 126 covering the barrier metal layer 122c.

As compared to the first grid structure 120a, the metal layer may not be formed over the barrier metal layer 122c in the second grid structure 120c. In addition, the second grid structure 120c may have a different width from the first grid structure 120a.

For example, the first grid structure 120a may be shifted in response to a CRA of the corresponding image sensing pixels (IPX). In this case, the first grid structures 120a may be formed to have the same width as each other in the pixel array 100. In contrast, the second grid structure 120c may be shifted in response to a CRA of the phase detection pixels LPD and RPD, and the second grid structure 120c may be formed to have different widths based on optical characteristics (e.g., light sensitivity) of other phase detection pixels LPD and RPD located around the corresponding phase detection pixels in a predetermined region (i.e., a sub-pixel region) and optical characteristics (e.g., light sensitivity) of the image sensing pixels (PX_G) located around the corresponding phase detection pixels and having the same color filter as the corresponding phase detection pixels in the predetermined region. That is, the second grid structure 120c may be formed to have different widths depending on where the second grid structure 120c is in the pixel array 100.

In this case, the method of FIG. 4 can be used here except for the determining of the width of the second grid structure 120c as shown in FIG. 10, which may include adjusting the width of each of the second grid structures 120c placed in the corresponding sub-pixel region in the situation where two sensitivity values LPDsens and RPDsens are not identical to each other (or in the situation where a difference between two sensitivity values LPDsens and RPDsens is in the predetermined range).

When the width of the second grid structure 120c is adjusted, the design system (not shown) may adjust each of the average value (LPDaver) of the first phase detection pixels (LPD) and the average value (RPDaver) of the second phase detection pixels (RPD) to be equal to or greater than ½ of the average value (PX_Gaver) of the image sensing pixels (PX_G), and at the same time may adjust each of the average value (LPDaver) of the first phase detection pixels (LPD) and the average value (RPDaver) of the second phase detection pixels (RPD) to be equal to or less than a threshold value corresponding to 1.2 times the average value (PX_Gaver) of the image sensing pixels (PX_G).

Alternatively, the width of the second grid structure 120c may be formed not to exceed the width of the device isolation structure 116. For example, the width of the second grid structure 120c may be equal to or less than the width of the device isolation structure 116 disposed between the photoelectric conversion regions 114 of the corresponding phase detection pixels LPD and RPD.

In some implementations, the operation for adjusting the width of each of the second grid structures 120c may be performed for each sub-pixel region in association with all sub-pixel regions R(1,1) to R(375,500) included in the pixel array 100. Therefore, the second grid structures 120c may be formed to have different width in units of sub-pixel regions, and the second grid structures 120b may be formed to have the same width within the same sub-pixel region.

Figure 11:
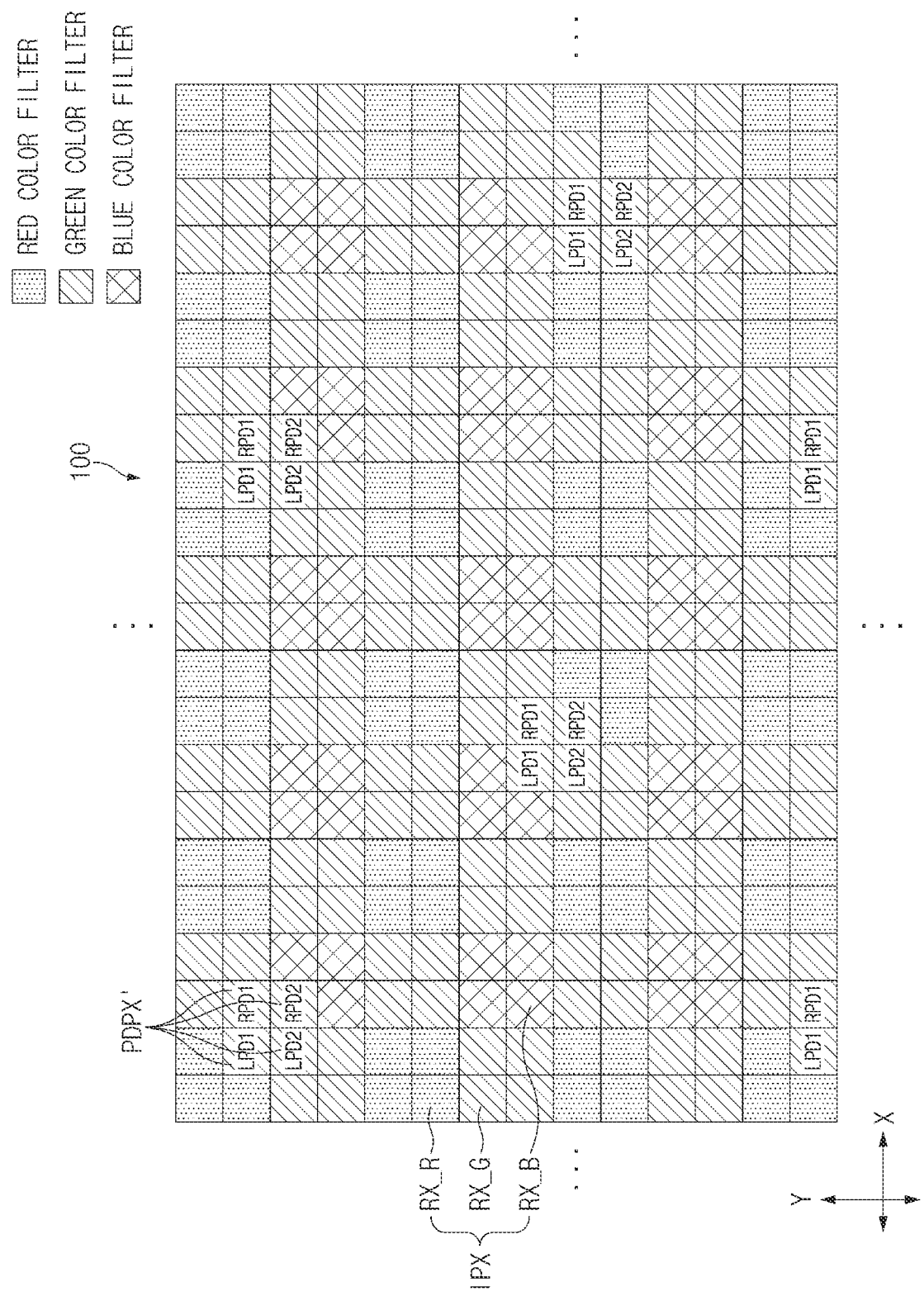
FIG. 11 is a plan view illustrating an example of the pixel array shown in FIG. 1 based on an embodiment of the disclosed technology.

FIG. 11 is a plan view illustrating an example of the pixel array shown in FIG. 1 based on an embodiment of the disclosed technology.

In some implementations, some of the features of FIG. 11 can be similar or identical to what is illustrated in FIG. 2. Some of the features of FIG. 11 can be different from what is illustrated in FIG. 2, as will be discussed below.

Referring to FIG. 11, the pixel array 100 may include a plurality of unit pixels consecutively arranged in row and column directions. Here, the plurality of unit pixels may include a plurality of image sensing pixels (IPX) and a plurality of phase detection pixels (PDPX').

Each of the phase detection pixels (PDPX') may be disposed between the image sensing pixels (IPX), and may include one group of phase detection pixels (LPD1, RPD1, LPD2, RPD2) disposed adjacent to each other in second and first directions of the pixel array so that both a phase difference generated in the first direction and a phase difference generated in the second direction can be detected. One pair of the phase detection pixels (PDPX') formed in an array may be consecutively arranged at regular intervals in the X-axis and Y-axis directions.

The phase detection pixels LPD1, RPD1, LPD2, and RPD2 may include color filters of the same color. For example, each of the phase detection pixels LPD1, RPD1, LPD2, and RPD2 may include a green color filter.

At S200 of FIG. 4, the design system (not shown) may calculate an average value of signal values of the first phase detection pixels (LPD1) for each sub-pixel region, may calculate an average value of signal values of the second phase detection pixels (RPD1) for each sub-pixel region, may calculate an average value of signal values of the third phase detection pixels (LPD2) for each sub-pixel region, may calculate an average value of signal values of the fourth phase detection pixels (RPD2) for each sub-pixel region, and may calculate an average value of signal values of the image sensing pixels (PX_G) for each sub-pixel region.

At S300 of FIG. 4, the design system (not shown) may calculate sensitivity values of the first to fourth phase detection pixels (LPD1, RPD1, LPD2, RPD2) by dividing the average value of signal values of each of the first to fourth phase detection pixels (LPD1, RPD1, LPD2, RPD2) by the average value of signal values of the image sensing pixels (PX_G).

Figure 12A:
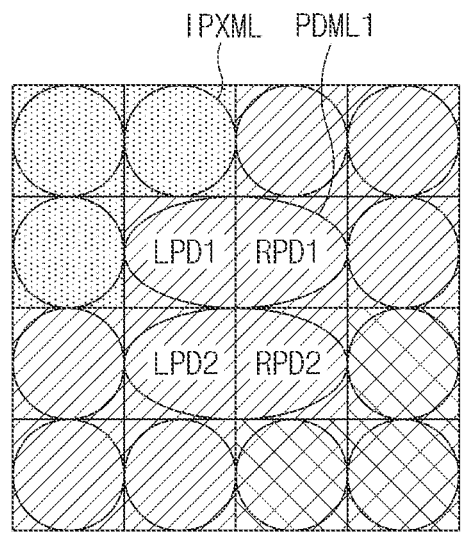
FIGS. 12A and 12B are diagrams illustrating examples of microlenses formed in unit pixels within a portion of a region that includes phase detection pixels shown in FIG. 11 based on some implementations of the disclosed technology.
Figure 12B:
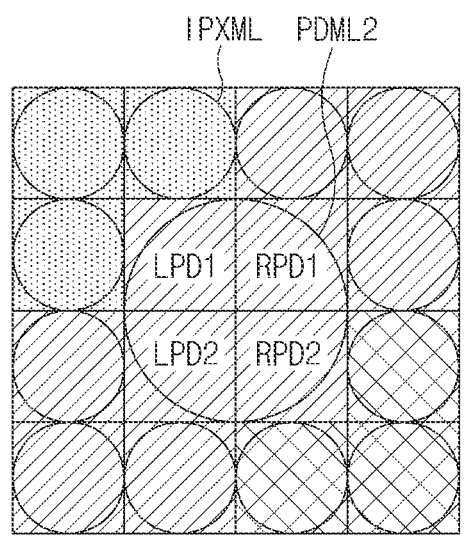

The design system (not shown) may compare the sensitivity values of the first to fourth phase detection pixels (LPD1, RPD1, LPD2, RPD2) with one another, and may determine the position and width of the second grid structure between the phase detection pixels (LPD1, RPD1, LPD2, RPD2) so that the sensitivity values of the first to fourth phase detection pixels (LPD1, RPD1, LPD2, RPD2) are identical to each other or a difference in sensitivity values is within a predetermined range, FIGS. 12A and 12B are diagrams illustrating examples of microlenses formed in unit pixels within a portion of a region that includes phase detection pixels shown in FIG. 11 based on some implementations of the disclosed technology.

Referring to FIG. 12A, in the image sensing pixels (IPX) of the pixel array 100, one microlens (IPXML) may be formed over each of the image sensing pixels. In the phase detection pixels (PDPX'), one microlens (PDML1) may be formed for two adjacent phase detection pixels (LPD1, RPD1), and another microlens (PDML1) may also be formed for another two adjacent phase detection pixels LPD2 and RPD2.

Alternatively, referring to FIG. 12B, in the image sensing pixels (IPX), one microlens (IPXML) may be formed over each of the image sensing pixels (IPX). In the phase detection pixels (PDPX'), one microlens (PDML2) may be formed to cover all color filters of four adjacent phase detection pixels LPD1, RPD1, LPD2, and RPD2.

In various implementations, the image sensing device based on some implementations of the disclosed technology can improve a grid structure of phase detection pixels, resulting in improvement in phase detection characteristics.

Although a number of illustrative embodiments have been described, it should be understood that various modifications or enhancements to the disclosed embodiments and other embodiments can be devised based on what is described and/or illustrated in this patent document.

What is claimed is:

1. An image sensing device comprising:
  a pixel array including a plurality of image sensing pixels and phase detection pixel pairs disposed between the image sensing pixels, the plurality of image sensing pixels structured to detect incident light to generate first electrical signals carrying images in the incident light, the phase detection pixel pairs including phase detection pixels structured to generate second electrical signals for calculating a phase difference between the images,
  wherein the pixel array includes:
    a plurality of photoelectric conversion regions formed in a substrate to correspond to the image sensing pixels and the phase detection pixels;
    a plurality of device isolation structures disposed in the substrate to isolate the photoelectric conversion regions from one another;
    a plurality of color filters disposed over the substrate to correspond to the image sensing pixels and the phase detection pixel pairs;
    a first grid structure disposed between a color filter of a first image sensing pixel, among the plurality of image sensing pixels, and a color filter of a first phase detection pixel pair adjacent to the first image sensing pixel from among the phase detection pixel pairs, and shifted by a first distance from a first device isolation structure, among the plurality of device isolation structures, disposed between a photoelectric conversion region of the first image sensing pixel and photoelectric conversion regions of the first phase detection pixel pair; and
    a second grid structure disposed in the color filter of the first phase detection pixel pair, and shifted by a second distance different from the first distance from a second device isolation structure, among the plurality of device isolation structures, disposed between photoelectric conversion regions of the first phase detection pixel pair.

2. The image sensing device according to claim 1, wherein:
  the first grid structure includes a capping layer that covers a stacked structure of a first material layer and a second material layer; and
  the second grid structure includes the capping layer that covers a monolayer structure formed of the first material layer without the second material layer.

3. The image sensing device according to claim 2, wherein:
  the first material layer is formed to include at least one of titanium (Ti) or titanium nitride (TiN).

4. The image sensing device according to claim 3, wherein:
  the second material layer is formed to include at least one of a metal material, air, or an insulation material.

5. The image sensing device according to claim 1, wherein each of the phase detection pixel pairs includes: two phase detection pixels adjacent to each other; or four phase detection pixels adjacent to each other.

6. The image sensing device according to claim 1, wherein:
  the second grid structure has different second distances based on a position of the first phase detection pixel pair within the pixel array.

7. The image sensing device according to claim 6, wherein:
  the pixel array is divided into a plurality of sub-pixel regions, each of which includes a predetermined number of phase detection pixel pairs; and
  the second distance of the second grid structure in a sub-pixel region is different from the second distance of the second grid structure in another sub-pixel region.

8. The image sensing device according to claim 7, wherein:
  all the second grid structures disposed in the same sub-pixel region are shifted by the same distance.

9. An image sensing device comprising:
  a pixel array including a plurality of image sensing pixels and phase detection pixel pairs disposed between the image sensing pixels, the plurality of image sensing pixels structured to detect incident light to generate first electrical signals carrying images in the incident light, the phase detection pixel pairs including a plurality of phase detection pixels structured to generate second electrical signals for determining a phase difference between the images,
  wherein the pixel array includes:
    a plurality of first grid structures disposed between the image sensing pixels, and between the image sensing pixels and the phase detection pixel pairs; and a plurality of second grid structures disposed between the plurality of phase detection pixels, wherein the second grid structures have a different width from the first grid structures.

10. The image sensing device according to claim 9, wherein:

the first grid structure includes a capping layer that covers a stacked structure of a first material layer and a second material layer; and the second grid structure includes the capping layer that covers a monolayer structure formed of the first material layer without the second material layer.

11. The image sensing device according to claim 10, wherein:

the first material layer is formed to include at least one of titanium (Ti) or titanium nitride (TiN).

12. The image sensing device according to claim 11, wherein:

the second material layer is formed to include at least one of a metal material, air, or an insulation material.

13. The image sensing device according to claim 9, wherein each of the phase detection pixel pairs includes two phase detection pixels adjacent to each other; or four phase detection pixels adjacent to each other.

14. The image sensing device according to claim 9, wherein:

the second grid structures have different widths from each other based on a position of corresponding phase detection pixel pairs.

15. The image sensing device according to claim 14, wherein:

the pixel array is divided into a plurality of sub-pixel regions, each of which includes a predetermined number of phase detection pixel pairs; and different second grid structures corresponding to different phase detection pixel pairs in different sub-pixel regions have different widths from each other.

16. The image sensing device according to claim 15, wherein:

all of the second grid structures disposed in the same sub-pixel region have the same width.

17. The image sensing device according to claim 9, wherein:

the second grid structure has a width that is equal to or less than a width of a device isolation structure disposed between photoelectric conversion regions of the phase detection pixels.

18. The image sensing device according to claim 9, further comprising a plurality of color filters disposed over the image sensing pixels and the phase detection pixel pairs.

19. The image sensing device according to claim 18, wherein the color filters for phase detection pixels within one phase detection pixel pair are of a common color.

20. The image sensing device according to claim 18, wherein the color filters for the phase detection pixel pairs are of a common color.

* * * * *